United States Patent
Kim et al.

(10) Patent No.: US 7,369,595 B2
(45) Date of Patent: May 6, 2008

(54) DISTRIBUTED BRAGG REFLECTOR (DBR) STRUCTURE IN VERTICAL CAVITY SURFACE EMITTING LASER (VCSEL) DIODE, METHOD OF MANUFACTURING THE SAME, AND VCSEL DIODE

(75) Inventors: Ki Soo Kim, Daejeon (KR); Won Seok Han, Daejeon (KR); Sung Bock Kim, Daejeon (KR); Dae Kon Oh, Daejeon (KR)

(73) Assignee: Electronics and Telecommunications Research Institute, Deejeon (KR)

( * ) Notice: Subject to any disclaimer, the term of this patent is extended or adjusted under 35 U.S.C. 154(b) by 0 days.

(21) Appl. No.: 11/544,832

(22) Filed: Oct. 5, 2006

(65) Prior Publication Data
US 2007/0127535 A1 Jun. 7, 2007

(30) Foreign Application Priority Data
Dec. 6, 2005 (KR) .................... 10-2005-0118196
Jun. 1, 2006 (KR) .................... 10-2006-0049238

(51) Int. Cl.
*H01S 5/00* (2006.01)
*H01S 3/08* (2006.01)

(52) U.S. Cl. ........................ 372/50.11; 372/50.124; 372/99

(58) Field of Classification Search ............. 372/50.11, 372/50.124, 99
See application file for complete search history.

(56) References Cited

U.S. PATENT DOCUMENTS

| 6,621,843 B2 | 9/2003 | Yoo et al. |
| 6,721,348 B2 | 4/2004 | Moser et al. |
| 2002/0075922 A1 | 6/2002 | Yoo et al. |

FOREIGN PATENT DOCUMENTS

| KR | 1019910020979 | 12/1996 |
| KR | 1020010048104 | 6/2001 |
| KR | 1020040010719 | 1/2004 |
| KR | 1020040050249 | 6/2004 |

*Primary Examiner*—Armando Rodriguez
(74) *Attorney, Agent, or Firm*—Ladas & Parry LLP

(57) ABSTRACT

A DBR structure in a VCSEL diode, a method of manufacturing the DBR structure, and a VCSEL diode are provided. The DBR structure in the VCSEL diode includes: an InAlGaAs layer having a predetermined refractive index and disposed on an InP substrate; a first InAlAs layer having a lower refractive index than the InAlGaAs layer and disposed on the InAlGaAs layer; an InP layer having a lower refractive index than the InAlGaAs layer and disposed on the first InAlAs layer; and a second InAlAs layer having a lower refractive index than the InAlGaAs layer and disposed on the InP layer. Thus, the DBR structure can reduce optical loss due to type-II band line-up at a junction between the InAlGaAs layer and the InP layer, and thus improve device characteristics.

15 Claims, 4 Drawing Sheets

(a)　　(b)

DISTRIBUTED BRAGG REFLECTOR (DBR) STRUCTURE IN VERTICAL CAVITY SURFACE EMITTING LASER (VCSEL) DIODE, METHOD OF MANUFACTURING THE SAME, AND VCSEL DIODE

CROSS-REFERENCE TO RELATED APPLICATION

This application claims priority to and the benefit of Korean Patent Application Nos. 2005-118196, filed Dec. 6, 2005, and 2006-49238, filed Jun. 1, 2006, the disclosures of which are incorporated herein by reference in their entirety.

BACKGROUND

1. Field of the Invention

The present invention relates to a distributed Bragg reflector (DBR) structure, a method of manufacturing the same, and a vertical cavity surface emitting laser (VCSEL) diode with the DBR structure. More particularly, the present invention relates to a DBR structure having an InAlAs/InP/InAlAs layer stacked on an InAlGaAs layer in a VCSEL diode, a method of manufacturing the DBR structure, and a VCSEL diode with the DBR structure.

2. Discussion of Related Art

Semiconductor laser diodes, in general, include edge emitting laser diodes and VCSEL diodes. An edge emitting laser diode has a cavity structure parallel to a stack surface of a device and emits a laser beam parallel to the stack surface. A VCSEL diode has a cavity structure perpendicular to a stack surface of the device and emits a laser beam perpendicular to the device's stack surface.

VCSEL diodes are widely used in optical communications, optical data writing, and holographic memories because they have a low driving current and a low beam divergence compared to edge emitting laser diodes. VCSEL diodes can oscillate in a single longitudinal mode and can be easily manufactured and tested in a wafer state, resulting in superior characteristics compared to edge emitting laser diodes. Additionally, since VCSEL diodes are capable of high-speed modulation and can emit a circular beam, they are easily coupled to an optical fiber and can be arranged in a two-dimensional array.

Meanwhile, a semiconductor laser diode has three necessary components for laser oscillation by stimulated emission: (i) an optically active layer, (ii) a cavity region, and (iii) mirrors. In particular, a VCSEL diode has a high reflectivity DBR structure that functions as a mirror at both sides of the cavity region having the optically active layer.

Usually, a DBR structure applicable in a VCSEL diode consists of two material layers with different refractive indices, and the material layers are alternately stacked to have a thickness of ¼ of the laser wavelength. In order to obtain high reflectivity, there should be a large difference between the refractive indices of the two materials. Therefore, GaAs and AlAs which have quite different refractive indices and are capable of being lattice-matched are widely used. A VCSEL diode manufactured using GaAs is adequately employed in a short wavelength (1 µm or less) laser diode.

Also, a method of manufacturing an optical communication device for medium and long distance transmission that emits a long wavelength (for example, 1.3 µm or 1.55 µm) beam having minimal loss in an optical fiber has been suggested. E. Hall et al. have suggested a VCSEL diode having a bandwidth of 1.55 µm using an AlAsSb/InAlGaAs DBR structure and an AlAsSb/AlGaAsSb DBR structure, which are based on Sb and have a large refractive index difference of about 0.43-0.44 (E. hall et al., Electron. Lett. 35, 425 (1999) and Electron. Lett. 36, 1465 (2000)). However, in the case of manufacturing a Sb-based laser diode, there are disadvantages such as complexity in growing the material layers forming a DBR structure, low thermal conductivity, and reduced device reliability.

In addition, a laser diode manufactured on an InP substrate using InP/InGaAsP and InAlGaAs/InAlAs has been suggested. The diode has a relatively small refractive index difference between the two materials (0.27 and 0.3) and thus does not easily yield high reflectivity. Also, if stack periods of InAlAs/InAlGaAs are repeated, defects are formed on the DBR structure's surface as its thickness increases, resulting in deterioration of device quality. Therefore, recently, an InP-induced InAlGaAs/InP DBR structure that has a relatively large refractive index difference (0.34) compared to InP/InGaAsP and InAlGaAs/InAlAs, and good thermal conductivity, has been suggested. However, when a thin film is grown by combining these two materials, an As carry-over effect occurs after growth of the InAlGaAs layer and prior to growth of the InP layer, a thin film growth interface between the two materials is not even, and thus a transitional layer such as an InAsP layer may be produced. Therefore, a complicated growth interruption is used to manufacture an InAlGaAs/InP DBR structure having a high quality epitaxial characteristic (T. C. Lu et al., Journal of Crystal Growth., 250, 305 (2003); T. C. Lu et al., Material Sci. & Eng. B107, 66 (2004)).

Below, an InAlGaAs/InP DBR structure forming a VCSEL diode and problems associated with its composition will be described in detail with reference to the drawings.

FIG. 1 is a schematic side cross-sectional view (a) of a conventional vertical cavity surface emitting laser (VCSEL) diode including an InAlGaAs/InP DBR structure, and a diagram (b) illustrating a vertical cavity surface emitting energy band of the VCSEL diode.

Referring to FIG. 1, a conventional VCSEL diode 100 includes an InP substrate 110, a lower DBR structure 120 disposed on the InP substrate 110, a cavity 130 disposed on the lower DBR structure 120, and an upper DBR structure 140 disposed on the cavity 130.

The cavity 130 includes a pair of InP layers 131 serving as a guide layer and a clad layer of an optical field, and an active layer 132 interposed between the InP layers 131. The active layer 132 includes a pair of barrier layers 133 contacting the InP layers 131 and a quantum well layer 134 interposed between the barrier layers 133. The depth (d) of the cavity 130, if a laser wavelength is denoted by $\lambda$, generally is $d=(k+½)\times\lambda$ (k=an integer). The quantum well layer 134 of the cavity 130 formed as mentioned above may have a maximum electric field strength. The cavity 130 of FIG. 1 is just an example, and various structures such as a tunnel junction have recently come under study.

The DBR structures 120 and 140 disposed on and under the cavity 130 have a form of alternating stacks of InAlGaAs layers 121 and 141 and InP layers 122 and 142. In general, if a wavelength is $\lambda$, and refractive indices of two materials are $n_1$ and $n_2$ respectively, thicknesses of the InAlGaAs layers 121 and 141 and InP layers 122 and 142 are $\lambda/4n_1$ and $\lambda/4n_2$, respectively. When the DBR structures are manufactured with a combination of the InAlGaAs layers 121 and 141 and InP layers 122 and 142, compositions of the InAlGaAs layers 121 and 141 should have the largest possible difference in refractive index from the InP layers 122 and 142, and energy band gaps of the InAlGaAs layers 121 and 141 should be larger in order not to absorb light at the wavelength of the active layer 132.

In the InAlGaAs/InP DBR structures 120 and 140, GaAs and AlAs are lattice-matched, and $In_{0.52}Ga_{0.48}As$ is lattice-matched to the InP substrate. For this reason, in the InAlGaAs material, when a composition ratio of [Ga+Al] is selectively changed within about 48% depending on usage while a composition ratio of In is about 52%, the InAlGaAs material can be lattice-matched to the InP substrate. In the case that the DBR structures 120 and 140 are employed in a VCSEL diode having a wavelength of 1.55 μm, as the composition ratio of Ga in $In_{0.52}AlGaAs$ increases, the photoluminescence wavelength becomes longer and the refractive index difference from InP increases while the lattice-matching to InP is maintained. So, there is no difficulty in adopting an InAlGaAs composition. Consequently, with the InAlGaAs 121/InP 122 DBR structure, high reflectivity can be obtained even with only about 35 stack periods.

However, because wavelength and refractive index are inversely proportional, in the case of employing the DBR structure having the above composition in a VCSEL diode having a wavelength of 1.3 μm, it is not easy to set the composition of the InAlGaAs material. For example, when InAlGaAs having a wavelength of about 1.2 μm, which does not overlap a wavelength of 1.3 μm, is chosen, the InAlGaAs is joined to InP in a band line-up of type II, not type I. For this reason, a transition wavelength may broadly range from 1.28 to 1.3 μm, thereby overlapping the 1.3 μm laser wavelength. In this case, a photon produced from the active layer of the VCSEL diode having a laser oscillation wavelength of 1.3 μm round-trips in the multiple-period DBR layer without reflection gain. In result, the photon is taken by an absorption band formed by the type-II band line-up, and thus overall performance of the laser diode deteriorates.

Referring to (b) of FIG. 1, type-II band line-up is formed in the in AlGaAs/InP DBR structures 120 and 140. In the case that the InAlGaAs/InP DBR structure 120 is employed in the VCSEL diode using a wavelength of 1.3 μm, the stacking period of InAlGaAs/InP should be increased in order not to form an absorption band corresponding to around the laser oscillation wavelength in the DBR layer. Also, selecting InAlGaAs, which has a relatively short wavelength, requires that the number of stack periods of the DBR structure be increased to obtain high reflectivity.

For example, InP (refractive index: about 3.2) and InAlGaAs (refractive index: about 3.4) used in the VCSEL diode oscillating at 1.3 μm have thicknesses of about 101.6 nm and about 94 nm, respectively. Thus, there should be at least 48 stack periods in order to obtain a high reflectivity of at least about 99.5%. As such, since increasing the stack periods may cause deterioration of properties of the device due to formation of defects on its surface, a composition of InAlGaAs having a wavelength as close as possible to an oscillation wavelength should be selected to reduce the number of stack periods of the DBR structure.

FIG. 2A is a graph plotting photoluminescence intensity and reflectivity according to a wavelength of an InAlGaAs/InP DBR in accordance with a conventional art. And, FIG. 2B is a diagram illustrating emission/absorption transition occurring due to type-II band line-up in a conventional InAlGaAs/InP junction. Considering only compositions of InAlGaAs layers 121 and 141 having a wavelength of 1.2 μm, since a photoluminescence (PL) wavelength is 1.2 μm, reflectivity should not be affected. However, an actual PL wavelength produced by forming a junction with InP layers 122 and 142 is 1.29 μm because of type-II transition, as shown in FIG. 2B. Accordingly, in a PL wavelength region, a stop-band of reflectivity is not maintained at a high level of reflectivity and reflectivity drops to form a deep. Consequently, photons produced from an active layer 132 of a 1.3 μm VCSEL diode are absorbed while traveling through the DBR structure, such that overall efficiency of the laser diode deteriorates and the wavelength of the laser changes depending on the temperature, which can have a critical, adverse effect on characteristics of the device.

SUMMARY OF THE INVENTION

The present invention is directed to a DBR structure of a vertical cavity surface emitting laser (VCSEL) diode which can reduce an absorption band due to type-II band line-up occurring at a junction between InAlGaAs and InP layers because of intrinsic properties of each of the materials, a method of manufacturing the same, and a VCSEL diode.

The present invention is also directed to a DBR structure of a VCSEL diode which can reduce an absorption band due to type-II band line-up and enhance a surface characteristic of the DBR structure, thereby improving device characteristics, a method of manufacturing the same, and a VCSEL diode.

One aspect of the present invention provides a DBR structure in a VCSEL diode comprising: an InAlGaAs layer having a predetermined refractive index and disposed on an InP substrate; a first InAlAs layer having a lower refractive index than the InAlGaAs layer and disposed on the InAlGaAs layer; an InP layer having a lower refractive index than the InAlGaAs layer and disposed on the first InAlAs layer; and a second InAlAs layer having a lower refractive index than the InAlGaAs layer and disposed on the InP layer.

The InAlGaAs layer $(n_1, t_1)$ may have a thickness of $\lambda/4n_1$, and the first and second InAlAs layers $(n_2, t_2)$ and the InP layer $(n_3, t_3)$ may have a combined thickness (d) of $\lambda/4(2n_2, t_2 + n_3, t_3) = 1$ (here, $n_2$, $n_3$: refractive index, $t_2$, $t_3$: thickness). The first and second InAlAs layers may have a thickness of 5 to 30 nm. The InAlGaAs layer may have a refractive index of 3.3 to 3.5, and the first and second InAlAs layers may have a refractive index of 3.2 to 3.24. The InP layer may have a refractive index of 3.1 to 3.2.

Another aspect of the present invention provides a method of manufacturing a DBR structure in a VCSEL diode, comprising the steps of: forming an InAlGaAs layer having a predetermined refractive index on an InP substrate; forming a first InAlAs layer having a lower refractive index than the InAlGaAs layer on the InAlGaAs layer; forming an InP layer having a lower refractive index than the InAlGaAs layer on the first InAlAs layer; and forming a second InAlAs layer on the InP layer.

The InAlGaAs layer, the first and second InAlAs layers, and the InP layer may be doped with one of n-type and p-type dopants. In the case of using an intra-cavity junction, the InAlGaAs layer, the first and second InAlAs layers, and the InP layer may be undoped.

Still another aspect of the invention provides a VCSEL diode comprising: a lower DBR structure disposed on an InP substrate; a cavity disposed on the lower DBR structure; and an upper DBR structure disposed on the cavity, wherein at least one of the lower DBR structure and the upper DBR structure comprises an InAlGaAs layer having a predetermined refractive index; a first InAlAs layer having a lower refractive index than the InAlGaAs layer and disposed on the InAlGaAs layer; an InP layer having a lower refractive index than the InAlGaAs layer and disposed on the first InAlAs layer; and a second InAlAs layer having a lower refractive index than the InAlGaAs layer and disposed on the InP layer.

The InAlGaAs layer ($n_1, t_1$) may have a thickness of $\lambda/4n_1$, and the first and second InAlAs layers ($n_2, t_2$) and the InP layer ($n_3, t_3$) may have a combined thickness (d) of $\lambda/4(2n_2 t_2 + n_3 t_3) = 1$ (here, $n_2$, $n_3$: refractive index, $t_2$, $t_3$: thickness). The first and second InAlAs layers may have a thickness of 5 to 30 nm. The upper and lower DBR structures may be doped with one of n-type and p-type dopants. In the case of using an intra-cavity junction, the upper and lower DBR structures may be undoped. A laser having a wavelength of about 1 to 1.6 µm may be used.

BRIEF DESCRIPTION OF THE DRAWINGS

The above and other features and advantages of the present invention will become more apparent to those of ordinary skill in the art by describing in detail exemplary embodiments thereof with reference to the attached drawings in which.

DETAILED DESCRIPTION OF EXEMPLARY EMBODIMENTS

Hereinafter, exemplary embodiments of the present invention will be described in detail. However, the present invention is not limited to the exemplary embodiments disclosed below, but can be implemented in various modified forms. Therefore, the present exemplary embodiment is provided for complete disclosure of the present invention and to fully inform the scope of the present invention to those of ordinary skill in the art.

Figure 1:
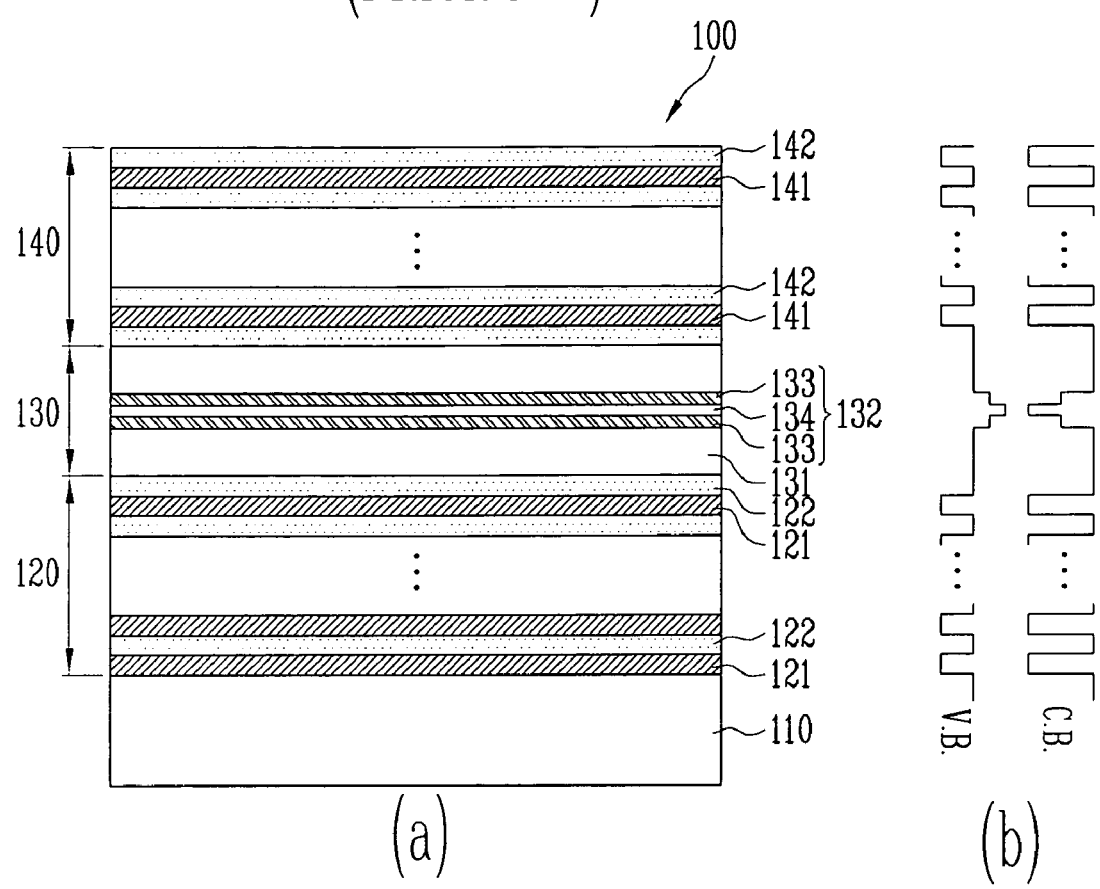
FIG. 1 is a schematic side cross-sectional view (a) of a conventional vertical cavity surface emitting laser (VCSEL) diode including an InAlGaAs/InP DBR structure, and a diagram (b) illustrating a vertical cavity surface emitting energy band of the VCSEL diode.
Figure 2A:
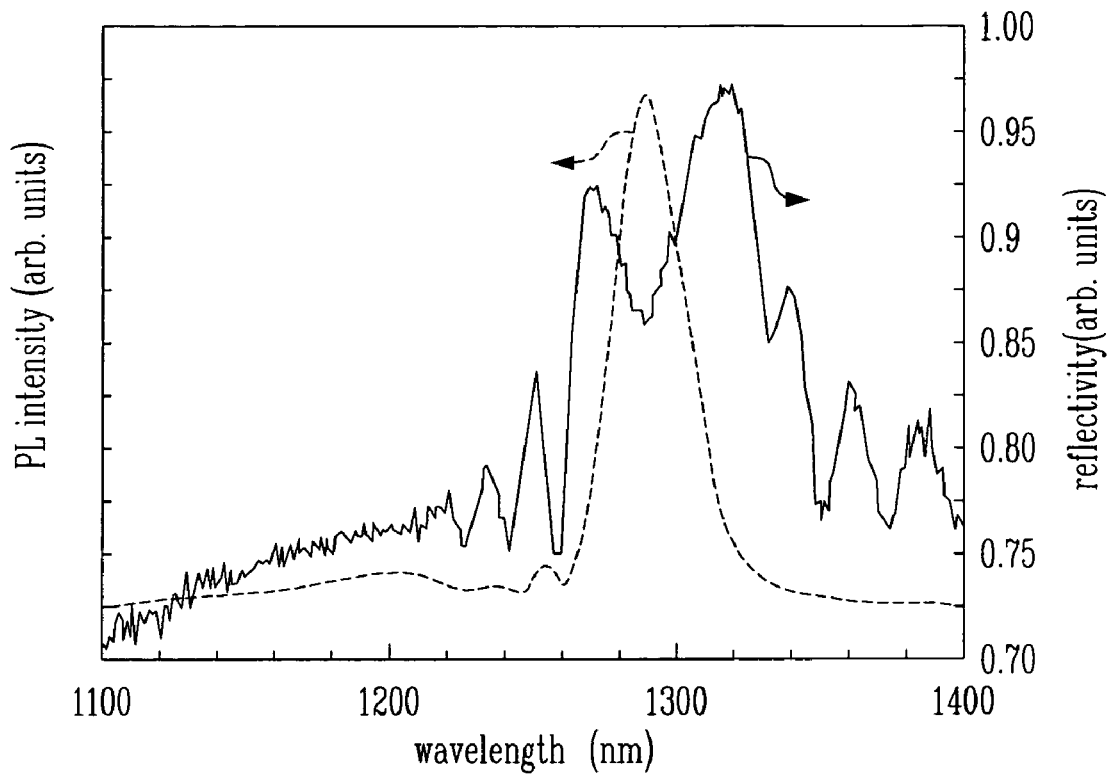
FIG. 2A is a graph plotting photoluminescence intensity and reflectivity according to a wavelength of an InAlGaAs/InP DBR in accordance with a conventional art.
Figure 2B:
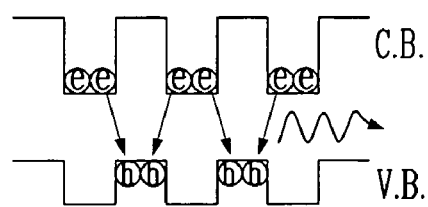
FIG. 2B is a diagram illustrating emission/absorption transition occurring due to type-II band line-up in a conventional InAlGaAs/InP junction.
Figure 3:
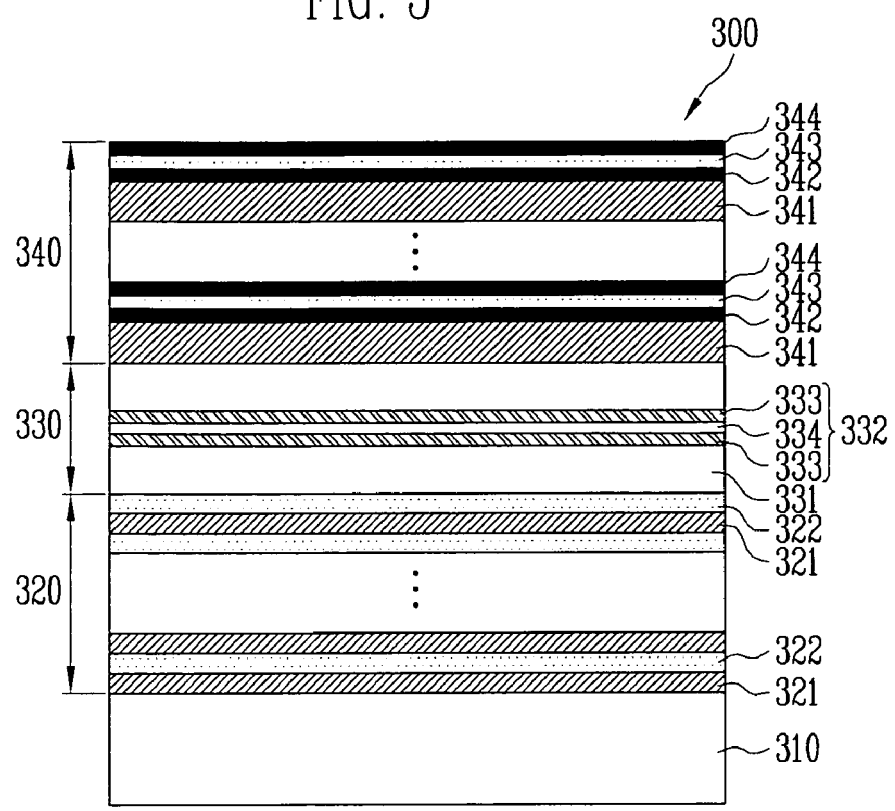
FIG. 3 is a schematic side cross-sectional view of a VCSEL diode according to the present invention.
Figure 4A:
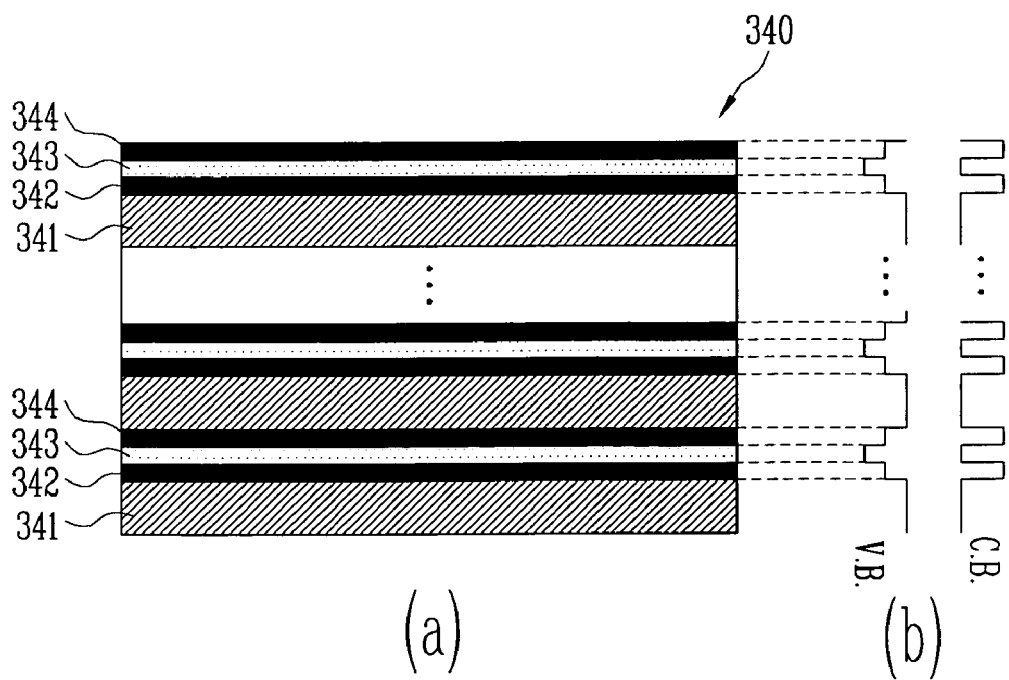
FIG. 4A is a detailed cross-sectional view (a) and an energy band diagram (b) of an upper DBR structure illustrated in FIG. 3.
Figure 4B:
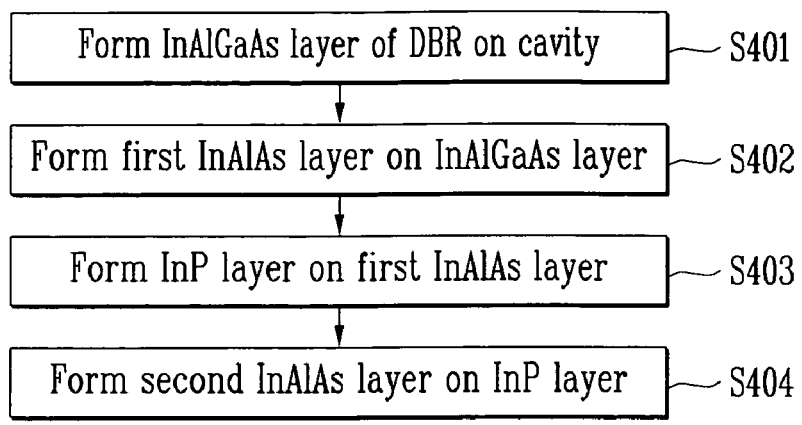
FIG. 4B is a flowchart illustrating a stacking order of an upper DBR structure according to the present invention.

FIG. 3 is a schematic side cross-sectional view of a vertical cavity surface emitting laser (VCSEL) diode according to the present invention, FIG. 4A is a detailed cross-sectional view (a) and an energy band diagram (b) of an upper DBR structure illustrated in FIG. 3, and FIG. 4B is a flowchart illustrating a stacking order of an upper DBR structure according to the present invention.

Referring to FIG. 3, a VCSEL diode 300 according to the present invention includes an InP substrate 310, a lower DBR structure 320 disposed on the InP substrate 310, a cavity 330 disposed on the lower DBR structure 320 and an upper DBR structure 340 disposed on the cavity 330.

The lower DBR structure 320 disposed on the InP substrate 310 has an alternating stack of an InAlGaAs layer 321 and an InP layer 322. Thicknesses of the InAlGaAs and InP layers 321 and 322, when λ denotes a wavelength and each of $n_1$ and $n_2$ denotes the refractive index of each material, are $\lambda/4n_1$ and $\lambda/4n_2$, respectively. In the case of manufacturing the DBR structure by combining the InAlGaAs and InP layers 321 and 322, the composition (stoichiometry) of the InAlGaAs layer 321 is the most important factor affecting a difference in refractive index from the InP layer 322, and a band gap of the InAlGaAs layer 321 should be formed to have a greater energy so as not to absorb a wavelength of an active layer 332 in the cavity 330.

The cavity 330 disposed on the lower DBR structure 320 includes an active layer 332 comprising a barrier layer 333 and a quantum well layer 334, and InP layers 331 serving as a guide layer and a clad layer of an optical field at both sides of the active layer 332. Here, a thickness (d) of the cavity 330 generally depends on a wavelength λ [dcavity=(k+½)×λ; k=an integer]. Forming a thickness using this formula can increase the strength of an electric field in the quantum well layer 334 located in the middle of the cavity 330. Besides the cavity structure of the exemplary embodiment, various cavity structures (for example, a tunnel junction, etc.) may be used to manufacture a VCSEL diode.

An upper DBR structure 340 is disposed on the cavity 330. The upper DBR structure 340 includes an InAlGaAs layer 341, InAlAs layers 342 and 344, and an InP layer 343. Referring to FIGS. 4A and 4B, a structure and manufacturing method of the upper DBR structure 340 will now be described in more detail.

First, the InAlGaAs layer 341 of the upper DBR structure 340 is formed on the cavity 330 (S401). The InAlGaAs layer 341 has a relatively high refractive index of about 3.3 to 3.5. Next, a first InAlAs layer 342 having a lower refractive index than the InAlGaAs layer 341, which is in the range of 3.2 to 3.24, is formed on the InAlGaAs layer 341 (S402). An InP layer 343 also having a lower refractive index than the InAlGaAs layer 341, which is in the range of 3.1 to 3.2, is formed on the first InAlAs layer 342 (S403). A second InAlAs layer 344 is formed on the InP layer 343 (S404). The first and second InAlAs layers 342 and 344 are formed to have a thickness ranging from 5 nm to 30 nm so that type-II transition between the InAlGaAs layer 341 and the InP layer 343 does not occur.

The upper DBR structure 340 completed according to S401 through S404 has the structure: InAlGaAs layer 341/[InAlAs layer 342/InP layer 343/InAlAs layer 344]. The DBR structure 340 formed in such a way may be doped with an n-type or p-type dopant. Alternatively, the DBR structure 340 may be undoped in the case that the InAlGaAs layer 341/[InAlAs layer 342/InP layer 343/InAlAs layer 344] is manufactured using an intra-cavity junction. The procedures of S401 to S404 are repeated until the DBR structure 340 has a desired number of stack periods. For example, when the total number of stacked layers is set at 48, the DBR structure 340 can be completed by repeating the procedures of S401 to S404 twelve times.

Meanwhile, the thickness of the InAlGaAs layer 341 is $\lambda/4n_1$ like the InAlGaAs and InP layers 321 and 322 constituting the lower DBR structure 320, and the thickness of the InAlAs layer 342/InP layer 343/InAlAs layer 344 is $\lambda/4(2n_2 t_2 + n_3 t_3) = 1$ ($n_2$, $n_3$: refractive index of each layer, $t_2$, $t_3$: thickness of each layer). For example, if the refractive index ($n_3$) of an InP layer is 3.2, the refractive index ($n_2$) of an InAlAs layer is 3.24 and the oscillation wavelength is 1.3

μm, when the thickness of the InAlAs layer 342 is 10 nm, the thickness of the InP layer 343 is 81 nm.

On the right side of FIG. 4A, a band diagram of a DBR structure manufactured by the above-described method is illustrated. According to the present invention, as shown in the band diagram, a transition occurs at a junction interface between the InAlGaAs and InP layers 341 and 343 due to type-II band line-up. That is, an energy level is not abrupt but rather smooth between the InAlGaAs and InP layers 321 and 322 due to the InAlAs layer 342 interposed between the two layers. In addition, in view of space, carriers in the InAlGaAs and InP layers 341 and 343 are spaced apart from each other by the thickness of each of the InAlAs layers 342 and 344 inserted between the InAlGaAs and InP layers 341 and 343, such that the absorption band produced due to type-II band line-up between the InAlGaAs and InP layers 341 and 343 may not be found.

In the above-described exemplary embodiment, though the upper DBR structure 340 of the VCSEL diode has the structure: InAlGaAs layer 341/[first InAlAs layer 342/InP layer 343/second InAlAs layer 344], the lower DBR structure 320 may be formed to have the structure: InAlGaAs layer/[InAlAs layer/InP layer/InAlAs layer]. Or, both the upper and lower DBR structures 340 and 320 may be formed to have the structure: InAlGaAs layer/[InAlAs layer/InP layer/InAlAs layer]. In the above-described exemplary embodiment, though the total stack number in each layer is set to 48 periods, the stack number in each layer may vary depending on required reflectivity.

Figure 5:
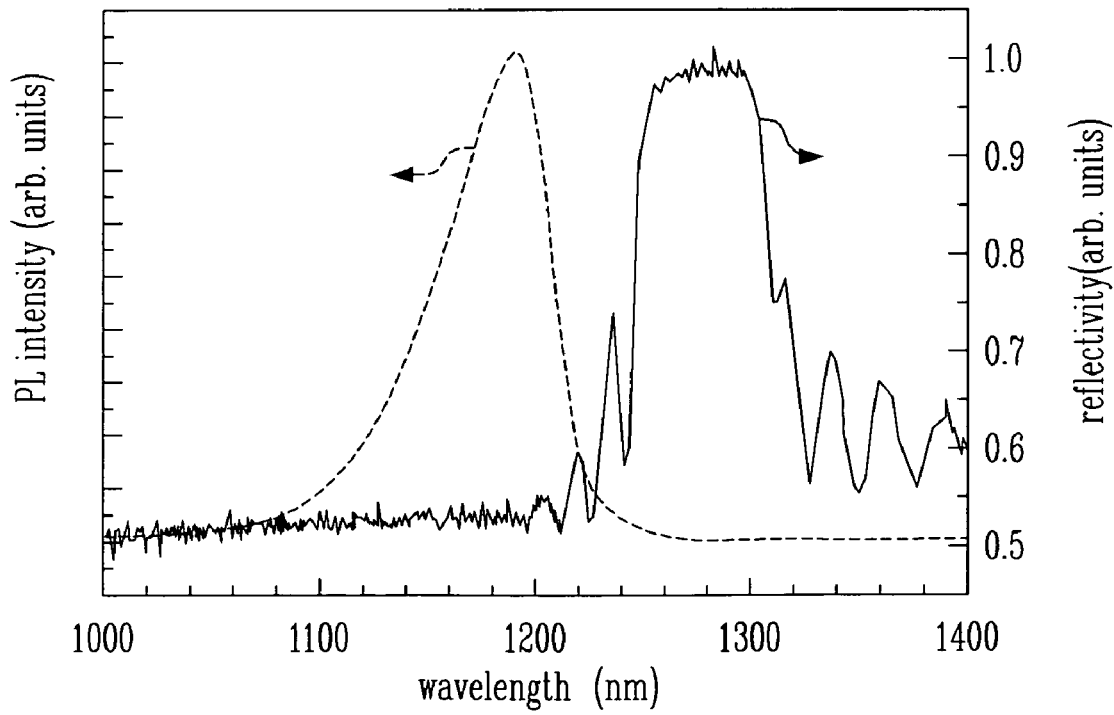
FIG. 5 is a graph of photoluminescence intensity and reflectivity versus wavelength of an InAlGaAs/[InAlAs/InP/InAlAs] DBR structure measured after its growth according to the present invention.

FIG. 5 is a graph of photoluminescence (PL) intensity and reflectivity versus wavelength of an InAlGaAs/[InAlAs/InP/InAlAs] DBR structure measured after its growth according to the present invention.

Referring to FIG. 5, an x-axis indicates a wavelength, and both y-axes indicate PL intensity and reflectivity. Compared with a PL transition wavelength of an epitaxially grown conventional 48-period InAlGaAs/InP DBR structure that produces a wide deep in reflectivity at 1.29 μm, in the case of using the InAlGaAs 341/[InAlAs 342/InP 343/InAlAs 344] DBR structure according to the present invention, the peak PL intensity was measured at around 1.2 μm, which is the same as the conventional InAlGaAs PL wavelength. Thus, it can be confirmed that there is no overlap with the reflectivity of the whole DBR structure.

This result shows that when a longer wavelength-VCSEL (LW-VCSEL) diode (about 1 to 1.6 μm) is manufactured, the DBR structure does not incur optical loss while photons produced from an active layer make round-trips in the DBR structure and obtain sufficient gain. Thus, a highly efficient LW-VCSEL diode (about 1 to 1.6 μm) can be manufactured using the stacked structure (InAlGaAs 341/[InAlAs 342/InP 343/InAlAs 344]).

As mentioned above, an InAlGaAs/[InAlAs/InP/InAlAs] DBR structure is employed in an LW-VCSEL diode so as to reduce an absorption band due to type-II band line-up occurring when InAlGaAs and InP layers are joined, thereby providing high reflectivity without optical loss of photons produced in an active layer.

Also, using the DBR structure providing high-reflectivity without optical loss, a VCSEL diode that has enhanced device characteristics and improved reliability regardless of variation of external conditions (for example, temperature, etc.) can be provided.

While the invention has been shown and described with reference to certain exemplary embodiments thereof, it will be understood by those skilled in the art that various changes in form and details may be made therein without departing from the spirit and scope of the invention as defined by the appended claims.

What is claimed is:

1. A DBR structure in a vertical cavity surface emitting laser (VCSEL) diode, comprising:
   an InAlGaAs layer having a predetermined refractive index and disposed on an InP substrate;
   a first InAlAs layer having a lower refractive index than the InAlGaAs layer and disposed on the InAlGaAs layer;
   an InP layer having a lower refractive index than the InAlGaAs layer and disposed on the first InAlAs layer; and
   a second InAlAs layer having a lower refractive index than the InAlGaAs layer and disposed on the InP layer.

2. The DBR structure according to claim 1, wherein the InAlGaAs layer ($n_1,t_1$) has a thickness ($t_1$) of $\lambda/4n_1$, and the first and second InAlAs layers ($n_2,t_2$) and the InP layer ($n_3,t_3$) have a combined thickness (d) of $\lambda/4(2n_2,t_2+n_3,t_3)=1$ (here, $n_2$, $n_3$: refractive index, $t_2$, $t_3$: thickness).

3. The DBR structure according to claim 1, wherein the first and second InAlAs layers have a thickness of 5 to 30 nm.

4. The DBR structure according to claim 1, wherein the InAlGaAs layer has a refractive index of 3.3 to 3.5.

5. The DBR structure according to claim 1, wherein the first and second InAlAs layers have a refractive index of 3.2 to 3.24.

6. The DBR structure according to claim 1, wherein the InP layer has a refractive index of 3.1 to 3.2.

7. A method of manufacturing a DBR structure in a VCSEL diode, comprising the steps of:
   forming an InAlGaAs layer having a predetermined refractive index on an InP substrate;
   forming a first InAlAs layer having a lower refractive index than the InAlGaAs layer on the InAlGaAs layer;
   forming an InP layer having a lower refractive index than the InAlGaAs layer on the first InAlAs layer; and
   forming a second InAlAs layer on the InP layer.

8. The method according to claim 7, wherein the InAlGaAs layer, the first and second InAlAs layers, and the InP layer are doped with one of n-type and p-type dopants.

9. The method according to claim 7, wherein the InAlGaAs layer, the first and second InAlAs layers, and the InP layer are undoped in the case of using an intra-cavity junction.

10. A vertical cavity surface emitting laser (VCSEL) diode, comprising:
    a lower DBR structure disposed on an InP substrate;
    a cavity disposed on the lower DBR structure; and
    an upper DBR structure disposed on the cavity,
    wherein at least one of the lower DBR structure and the upper DBR structure comprises:
    an InAlGaAs layer having a predetermined refractive index;
    a first InAlAs layer having a lower refractive index than the InAlGaAs layer and disposed on the InAlGaAs layer;
    an InP layer having a lower refractive index than the InAlGaAs layer and disposed on the first InAlAs layer; and
    a second InAlAs layer having a lower refractive index than the InAlGaAs layer and disposed on the InP layer.

11. The VCSEL diode according to claim 10, wherein the InAlGaAs layer ($n_1, t_1$) has a thickness ($t_1$) of $\lambda/4n_1$, and the first and second InAlAs layers ($n_2, t_2$) and the InP layer ($n_3, t_3$) have a combined thickness (d) of $\lambda/4(2n_2,t_2+n_3,t_3)=1$ (here, $n_2$, $n_3$: refractive index, $t_2$, $t_3$: thickness).

12. The VCSEL diode according to claim 10, wherein the first and second InAlAs layers have a thickness of 5 to 30 nm.

13. The VCSEL diode according to claim 10, wherein the upper and lower DBR structures are doped with one of n-type and p-type dopants.

14. The VCSEL diode according to claim 10, wherein the upper and lower DBR structures are undoped in the case of using an intra-cavity junction.

15. The VCSEL diode according to claim 10, using a laser having a wavelength of about 1 to 1.6 μm.

* * * * *